US011821862B2

(12) United States Patent
Kwak et al.

(10) Patent No.: US 11,821,862 B2
(45) Date of Patent: Nov. 21, 2023

(54) METHOD FOR MEASURING THE SPATIAL WATER PERMEABILITY PROFILE OF POROUS MEDIA BY USING NON-DESTRUCTIVE NUCLEAR MAGNETIC RESONANCE TECHNIQUE

(71) Applicant: SAUDI ARABIAN OIL COMPANY, Dhahran (SA)

(72) Inventors: Hyung Tae Kwak, Dhahran (SA); Marwah Mufid AlSinan, Al Qatif (SA); Jun Gao, Dhahran (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 88 days.

(21) Appl. No.: 17/454,707

(22) Filed: Nov. 12, 2021

(65) Prior Publication Data
US 2023/0152252 A1 May 18, 2023

(51) Int. Cl.
G01N 24/08 (2006.01)
G01R 33/50 (2006.01)
G01V 3/32 (2006.01)

(52) U.S. Cl.
CPC .......... G01N 24/081 (2013.01); G01R 33/50 (2013.01); G01V 3/32 (2013.01)

(58) Field of Classification Search
CPC ......... G01V 3/32; G01R 33/50; G01N 24/081
See application file for complete search history.

(56) References Cited

U.S. PATENT DOCUMENTS

| 4,719,423 A | 1/1988 | Vinegar et al. |
| 5,237,854 A | 8/1993 | Jones |
| 6,229,308 B1 | 5/2001 | Freedman |
| 6,646,437 B1 | 11/2003 | Chitale et al. |

(Continued)

FOREIGN PATENT DOCUMENTS

WO 2020185801 A1 9/2020

OTHER PUBLICATIONS

Skalinski, M. and Kenter, J., "Carbonate petrophysical rock typing: integrating geological attributes and petrophysical properties while linking with dynamic behaviour", Geological Society; Jan. 1, 2015 (31 pages).

(Continued)

Primary Examiner — Gregory H Curran
(74) Attorney, Agent, or Firm — Osha Bergman Watanabe & Burton LLP

(57) ABSTRACT

A method includes deriving spatial permeability along a core axis by saturating the rock with an aqueous solution, performing $T_2$ NMR on the saturated rock to detect spatial NMR data along the core axis, desaturating the rock, performing $T_2$ NMR on the desaturated rock to detect spatial NMR data along the core axis, determining the spatial cutoff data for the saturated and desaturated rock along the core axis, and analyzing the spatial NMR data. The method further includes deriving spatial permeability along a second core axis by additionally performing $T_2$ NMR on the saturated rock to detect spatial NMR data along a second core axis, performing $T_2$ NMR on the desaturated rock to detect spatial NMR data along a second core axis, and determining the spatial cutoff data for the saturated and desaturated rock along the second core axis.

16 Claims, 12 Drawing Sheets

(56) References Cited

U.S. PATENT DOCUMENTS

| | | |
|---|---|---|
| 6,859,034 B2 | 2/2005 | Chen |
| 9,081,117 B2 | 7/2015 | Wu et al. |
| 9,551,769 B2 | 1/2017 | Fordham et al. |
| 9,702,953 B1 | 7/2017 | Xiao et al. |
| 10,436,865 B2 | 10/2019 | Washburn |
| 10,900,915 B2 | 1/2021 | Gawankar et al. |
| 2008/0221800 A1 | 9/2008 | Gladkikh et al. |
| 2009/0043510 A1 | 2/2009 | Allen et al. |
| 2009/0177403 A1 | 7/2009 | Gzara |
| 2011/0153216 A1 | 6/2011 | Coope et al. |
| 2011/0198078 A1 | 8/2011 | Harrigan et al. |
| 2011/0204892 A1* | 8/2011 | Li .................... G01V 3/32 324/309 |
| 2014/0055134 A1 | 2/2014 | Fordham et al. |
| 2014/0285196 A1 | 9/2014 | Liu et al. |
| 2018/0259466 A1 | 9/2018 | Mitchell et al. |
| 2018/0259468 A1* | 9/2018 | Kwak .................. G01R 33/448 |
| 2019/0033238 A1* | 1/2019 | Al-Harbi .............. G01R 33/46 |
| 2019/0033239 A1 | 1/2019 | Gao et al. |
| 2019/0317034 A1 | 10/2019 | Kwak et al. |
| 2020/0158907 A1 | 5/2020 | Li et al. |
| 2020/0166449 A1 | 5/2020 | Green et al. |
| 2020/0408090 A1 | 12/2020 | Kadayam Viswanathan et al. |
| 2021/0190989 A1* | 6/2021 | Cheng .................. G01V 3/38 |

OTHER PUBLICATIONS

Coates et al.; "The MRIL In Conoco 33-1 An Investigation of a New Magnetic Resonance Imaging Log", SPWLA-1991-DD; Society of Petrophysicists and Well Log Analysts; Jun. 16, 1991; pp. 1-24 (24 pages).

Kenywon, W. E.; "Petrophysical Principles of Applications of NMR Logging", The Log Analyst; vol. 38; Issue 2; Mar. 1, 1997; pp. 21-43 (23 pages).

Petrov et al.; "T2 distribution mapping profiles with phase-encode MRI", Journal of Magnetic Resonance; vol. 209; Dec. 19, 2010; pp. 39-46 (8 pages).

Coates et al.; "A New Characterization of Bulk-Volume Irreducible Using Magnetic Resonance", SPWLA-1997-QQ; Society of Petrophysicists and Well Log Analysts; Jun. 1997; pp. 51-63 (13 pages).

Hassler et al.; "Measurement of Capillary Pressure in Small Core Samples", SPE-945114-G; Society of Petroleum Engineers; vol. 160; Dec. 1945; pp. 114-123 (10 pages).

Brooks, R. H. and Corey, A. T.; "Hydraulic Properties of Porous Media", Hydrology Papers, Colorado State University; Mar. 1964; pp. 1-37 (37 pages).

"Least Squares Fittings;" Oct. 13, 2021; pp. 1-4; Retrieved from the Internet: URL: https://mathworld.wolfram.com/LeastSquaresFitting.html (4 pages).

Jones, S. C.; "A New, Fast, Accurate Pressure-Decay Probe Permeameter", SPE-24757-PA; Society of Petroleum Engineers; vol. 9. Issue 3; Sep. 1, 1994; pp. 193-199 (7 pages).

Timur, A.; "An Investigation of Permeability, Porosity, & Residual Water Saturation Relationships For Sandstone Reservoirs", SPWLA-1968-VLXN4A2; The Log Analyst; vol. 9; Issue 4; Jul. 1968; pp. 8-17 (10 pages).

Lis-Sledziona, A.; "Petrophysical rock typing and permeability prediction in tight sandstone reservoir", Acta Geophysica; vol. 67; Aug. 29, 2019; pp. 1895-1911 (17 pages).

Timur, A.; "Pulsed Nuclear Magnetic Resonance Studies of Porosity, Movable Fluid, and Permeability of Sandstones"; Journal of Petroleum Technology; vol. 21; Issue 6; Jun. 1, 1969; pp. 775-786 (12 pages).

Freedman et al.; "Wettability, Saturation, and Viscosity From NMR Measurements", SPE-87340-PA; SPE Journal; vol. 8; Issue 4; Dec. 1, 2003; pp. 317-327 (11 pages).

Oraby, M. E. and Eubanks, D. L.; "Determination Of Irreducible Water Saturation Using Magnetic Resonance Imaging Logs (MRIL): A Case Study From East Texas, USA", SPE-37772; Society of Petroleum Engineers; Mar. 1997; pp. 155-162 (8 pages).

Gonzalez, A.; "Reliable Measurement of Saturation-dependent Relative Permeability in Tight Gas Sand Formations", Petrophysics; vol. 61; No. 3; Jun. 2020; pp. 286-302 (17 pages).

Vashaee et al.; "A comparison of magnetic resonance methods for spatially resolved T2 distribution measurements in porous media", Measurement Science and Technology; vol. 26; Apr. 9, 2015; pp. 1-16 (16 pages).

* cited by examiner

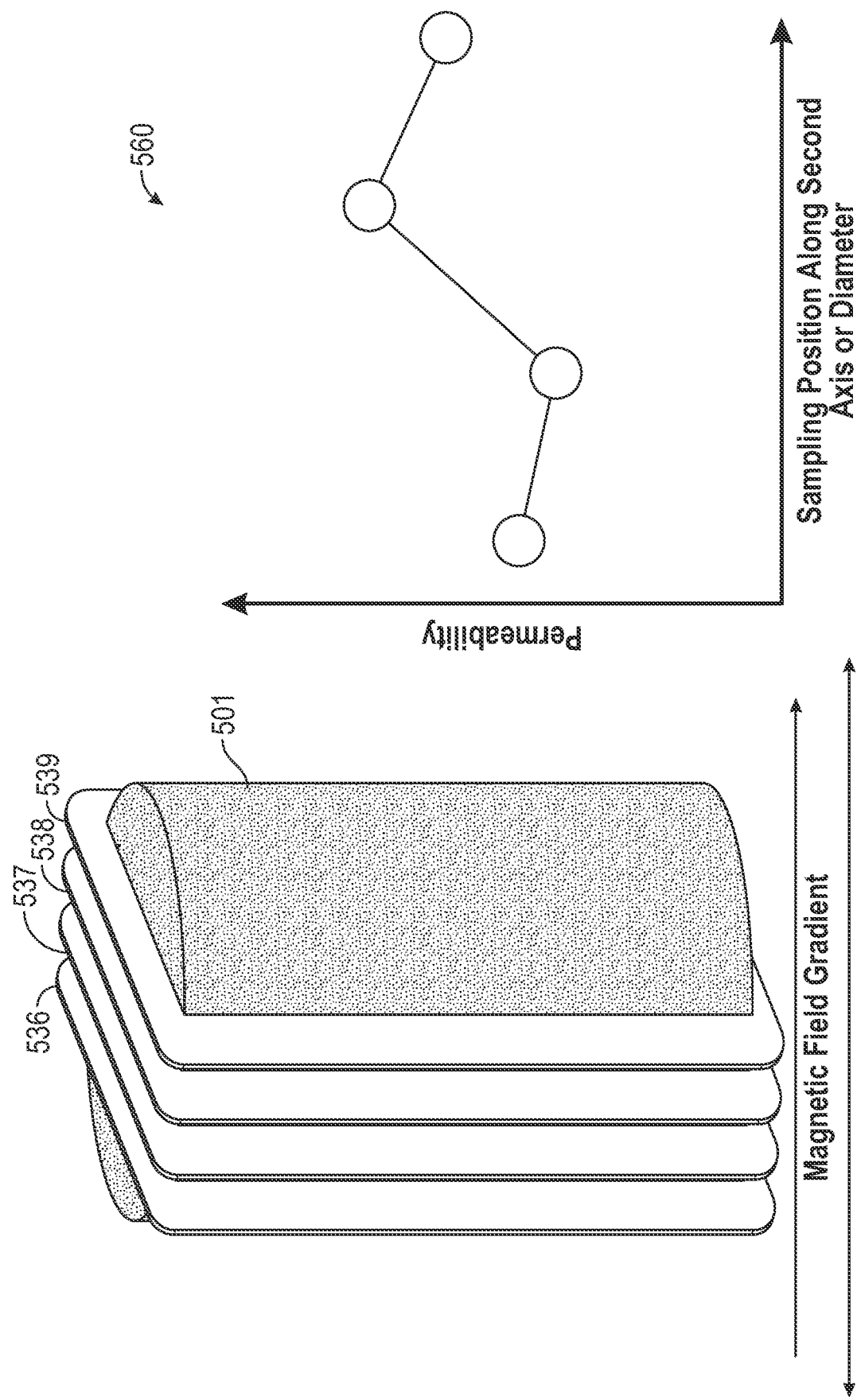

METHOD FOR MEASURING THE SPATIAL WATER PERMEABILITY PROFILE OF POROUS MEDIA BY USING NON-DESTRUCTIVE NUCLEAR MAGNETIC RESONANCE TECHNIQUE

BACKGROUND

Permeability is one of the most important properties of porous media. Permeability information of various materials is desired in geology. For example, the permeability of subsurface formations is crucial in predicting the potential of a reservoir (a hydrocarbon-bearing formation) to product hydrocarbons, like oil and gas. The reservoir configuration may vary in their structures. Some reservoirs, such as carbonate and sandstones, are highly heterogeneous in their pore structures, making predictions about permeability difficult. The continuous permeability profile information of these complicated reservoir configurations is becoming increasingly important for estimating the amount of hydrocarbons stored within.

Currently, the most developed technique used to measure and predict the spatial permeability profile of a reservoir is the probe permeameter technique. In this technique, the decrease in pressure on specific locations on a rock sample are measured with a probe to derive gas permeability. This technique is accepted as relatively robust for identifying general heterogeneity of rock samples, including quantifying thin beds, highly permeable beds, and permeability barriers.

SUMMARY

This Summary is provided to introduce a selection of concepts that are further described in the Detailed Description. This Summary is not intended to identify key or essential features of the claimed subject matter, nor is it intended to be used as an aid in limiting the scope of the claimed subject matter.

In one aspect, embodiments of the present disclosure relate to methods that include saturating the rock sample with an aqueous solution, performing $T_2$ NMR (nuclear magnetic resonance) on the saturated rock sample to detect spatial NMR data along a core sample axis, desaturating the rock sample, performing $T_2$ NMR on the desaturated rock sample to detect spatial NMR data along the core sample axis, determining the spatial cutoff data for the saturated and desaturated rock sample along a core sample axis, and analyzing the spatial NMR data to derive spatial permeability.

In another aspect, embodiments of the present disclosure relate to methods that include saturating the rock sample with an aqueous solution, performing $T_2$ NMR on the saturated rock sample to detect spatial NMR data along a core sample axis, performing $T_2$ NMR on the saturated rock sample to detect spatial NMR data along a second core sample axis, desaturating the rock sample, performing $T_2$ NMR on the desaturated rock sample to detect spatial NMR data along the core sample axis, performing $T_2$ NMR on the desaturated rock sample to detect spatial NMR data along a second core sample axis, determining the spatial cutoff data for the saturated and desaturated rock sample along a core sample axis, determining the spatial cutoff data for the saturated and desaturated rock sample along a second core sample axis, and analyzing the spatial NMR data to derive spatial permeability.

Other aspects and advantages will be apparent from the following Detailed Description and the appended Claims.

BRIEF DESCRIPTION OF DRAWINGS

FIG. 8C illustrates detecting spatial permeability profiles along a second sample axis according to one or more embodiments.

FIG. 8D illustrates determining spatial permeability profiles along a second sample axis according to one or more embodiments.

DETAILED DESCRIPTION

Figure 1:
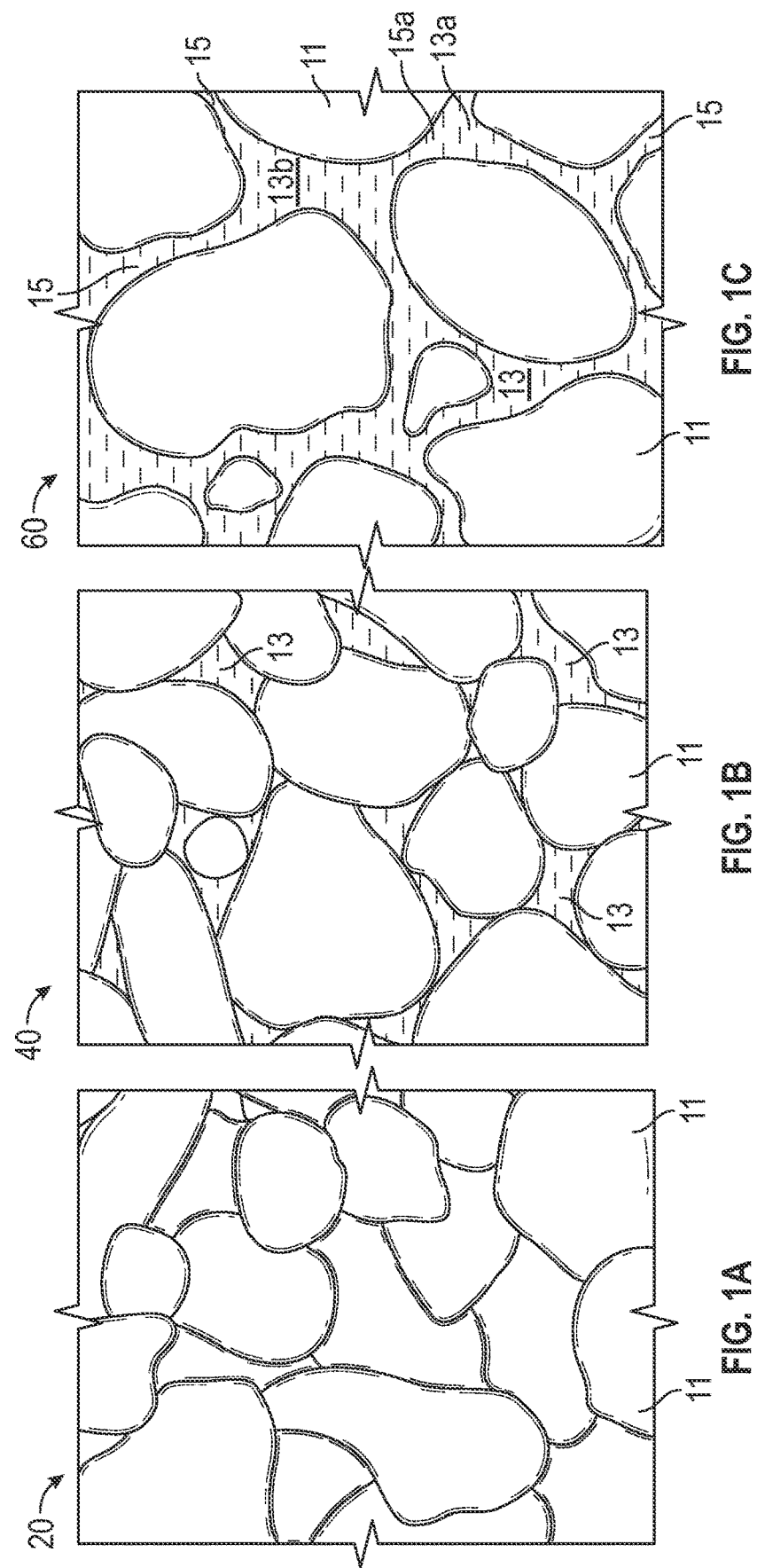
FIG. 1A-C illustrates varying porosity and permeabilities of the subsurface formations or rocks.

The previously-described probe permeameter technique has several limitations. Some of the limitations are due to the technique itself. For example, it is difficult to make measurements if the rock samples have a rough or uneven surface. A tight seal is required between the probe and the rock sample surface. Also, this technique provides inaccurate measurements for rock samples with high pore connectivity and heterogeneity because measurements are made from one spot that is dependent of the size of the probe aperture. This technique is also incapable of specifically measuring water permeability.

The method uses nuclear magnetic resonance (NMR) to measure the spatial water permeability along a porous rock sample. The water permeability profile is obtained with a simple and robust workflow using NMR measurements, analysis, and subsequent predictions. Also, the NMR technique is nondestructive because NMR utilized electromagnetism to measures the fluids filled inside the pores of a rock sample. The shape, surface, or composition of a rock sample are not affected by and do not affect the accuracy of measurements.

Various illustrative embodiments of the disclosed subject matter are described. In the interest of clarity, not all features of an actual implementation are described in this specification. It will of course be appreciated that in the development of any such actual embodiment, numerous implementation-specific decisions must be made to achieve the specific goals of the developers, such as compliance with system-related and business-related constraints, which will vary from one implementation to another. Moreover, it will be appreciated that such a development effort might be complex and time-consuming but may be a routine undertaking for those of ordinary skill in the art having the benefit of this disclosure.

The present subject matter will now be described with reference to the attached figures. Various structures, systems, and devices are schematically depicted in the Drawings for purposes of explanation only and to not obscure the present disclosure with details that are well known to those skilled in the art. Nevertheless, the attached Drawings are included to describe and explain illustrative examples of the present Detailed Disclosure. The words and phrases used should be understood and interpreted to have a meaning consistent with the understanding of those words and phrases by those skilled in the relevant art. No special definition of a term or phrase, that is, a definition that is different from the ordinary and customary meaning as understood by those skilled in the art, is intended to be implied by consistent usage of the term or phrase. To the extent that a term or phrase is intended to have a special meaning, that is, a meaning other than that understood by skilled artisans, such a special definition will be expressly set forth in the specification in a definitional manner that directly and unequivocally provides the special definition for the term or phrase. With reference to the attached figures, various illustrative embodiments of the systems, devices and method disclosed will now be described in more detail.

FIG. 1A-C illustrates varying porosity and permeabilities of the subsurface formations or rocks. Porosity and permeability are related properties of reservoir material; however, the differences between these properties are useful in understanding and predicting the ability of a reservoir to produce oil or gas. Generally, porosity is a measure of the void spaces inside materials. More specifically, the porosity of reservoir material is a measure of the ability of the reservoir material to hold a fluid. Mathematically, porosity may be defined as the open space in a rock divided by the total rock volume. Permeability is a measure of the ability of a reservoir material to transmit fluids. Here, permeability is the measure of the ability of a porous rock to transmit fluids through a reservoir material. The reservoir material may have varying degrees of porosity and permeability.

FIG. 1A is a diagram illustrating a rock 20 from a possible subsurface formation. The rock 20 is composed of many rock grains 11 that fit together. Each rock grain 11 is made of minerals and chemical compounds that may have different shapes and sizes. The rock grains 11 in the rock 20 are tightly joined together such that there are no voids between adjacent rock grains 11. The absence of voids between adjacent rock grains 11 prevents fluids from being released by the rock 20 as well as from flowing between the rock grains 11 and the rock 20. A subsurface formation composed of rocks without voids will have relatively low porosity and little permeability.

FIG. 1B is a diagram illustrating a rock 40 from a different possible subsurface formation. The rock 40 is composed of many rock grains 11 that fit together. The rock grains 11 in the rock 40 are joined; however, there are also voids between adjacent rock grains 11. The voids between the rock grain 11 are known as pores 13. Rocks with many pores are described to have high porosity. Even though the rock 40 has high porosity, the permeability may be low if the pores 13 are not inter-connected. If the pores are not connected, fluid may not be able to flow though the rock.

FIG. 1C is a diagram illustrating a rock 60 from another different possible subsurface formation. The rock 60 is composed of many rock grains 11 that fit together. The rock grains 11 in the rock 60 are joined, but there are also pores 13 between adjacent rock grains 11. Further, the pores 13 between rock grains 11 are connected to other pores 13 by channels 15. For example, a channel 15A fluidly connects a pore 13A to an adjacent pore 13B. The presence of channels connecting pores allows fluid to flow though the rock, making the rock permeable. The presence of many channels connecting the pores may make a rock permeable. Fluids, such as hydrocarbons, may be able to flow though the rock and the corresponding formation for retrieval.

Figure 2:
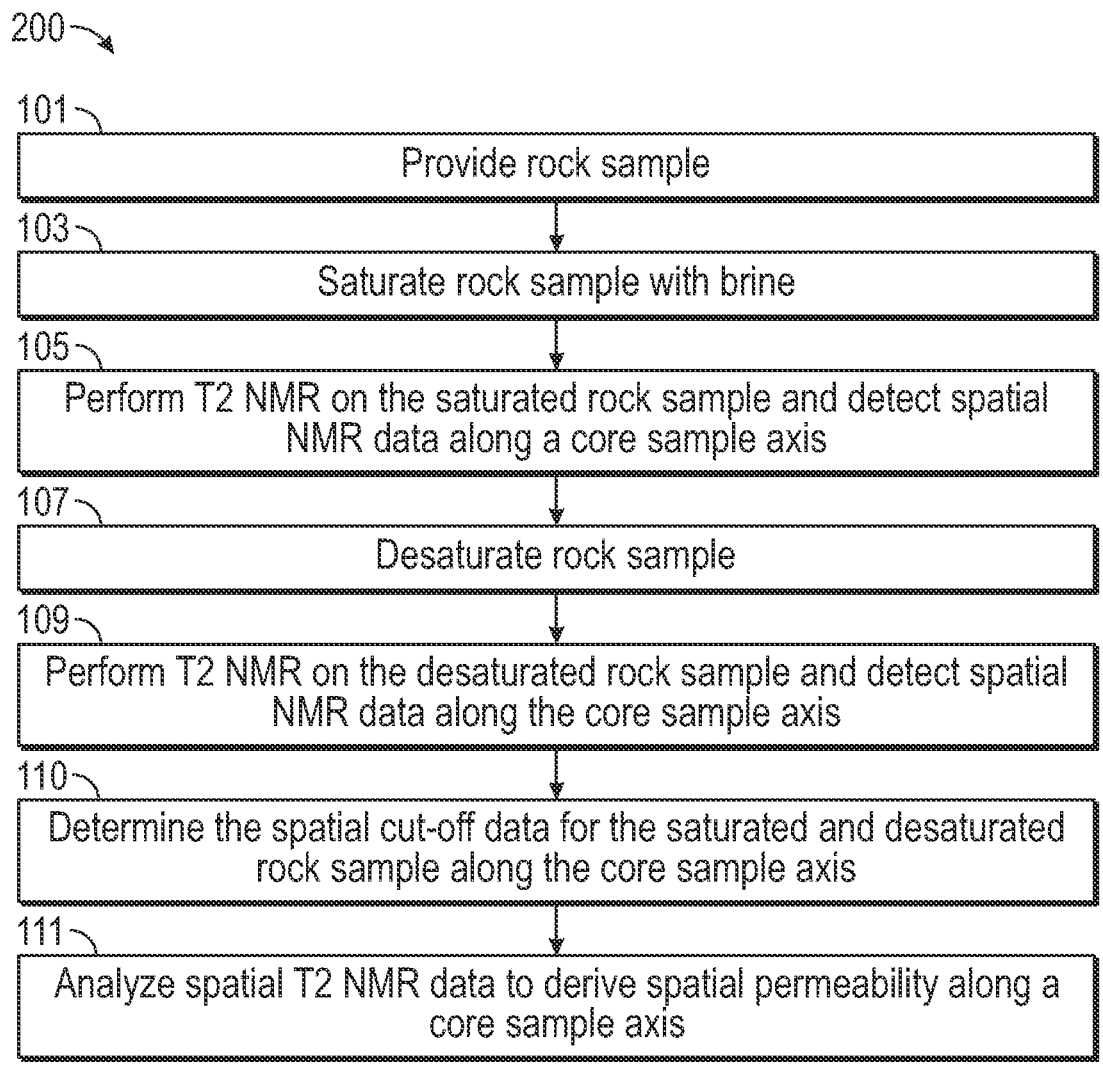
FIG. 2 illustrates a workflow according to one or more embodiments.

FIG. 2 illustrates a workflow. The steps may include: Providing a rock sample 101; saturating the rock sample with water 103; detecting spatial NMR data from the saturated rock sample by performing $T_2$ NMR measurements 105; desaturating the rock sample 107; detecting spatial NMR data from the desaturated rock sample by performing $T_2$ NMR measurements 109; determining the spatial cut-off data for both the saturated and desaturated samples 110; and analyzing the spatial NMR cut-off data to determine spatial permeability of the rock sample 111.

Figure 3:
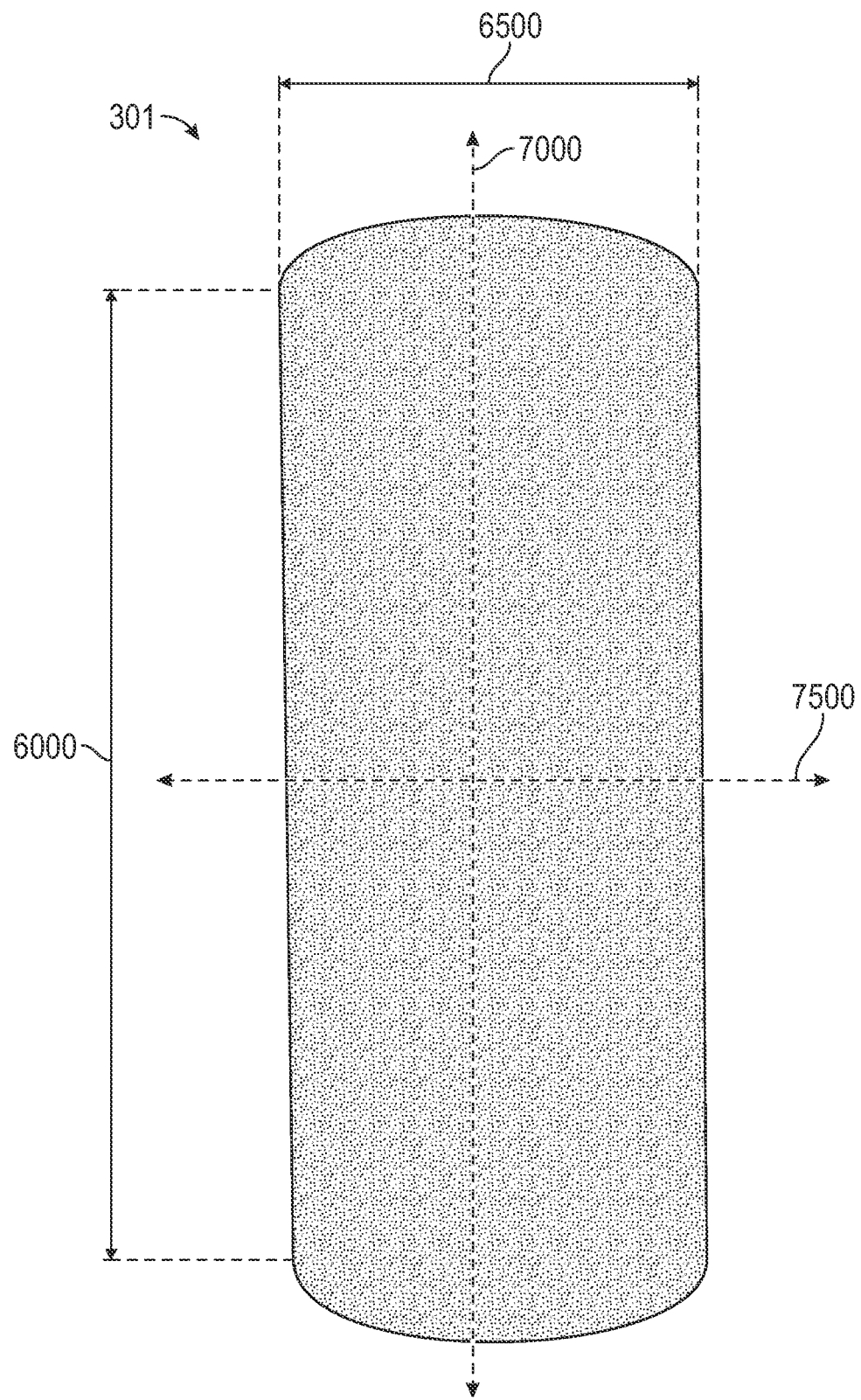
FIG. 3 illustrates the shape and structure of a rock sample according to one or more embodiments.

FIG. 3 illustrates the shape and structure of a rock sample. A rock sample 301 may be provided during step 101 of method 200. For example, the sample may be obtained during a drilling operation. A rock sample may be composed of many rock grains that fit and are cemented together through natural cementation processes. In doing so, a portion of the rock sample is porous, that is, it is comprised of voids defined by the surrounding rock grains, and a portion of the sample that is non-porous, better known as the rock matrix material comprising the rock grains and cementation material. The rock sample 301 may be carbonate or sandstone; however, those having skill in the art will appreciate that several different types of formations and formation rocks may be use in this workflow.

A person of ordinary skill in the art may envision that the provided rock sample may take any geometric or non-geometric form. As shown in FIG. 3, the rock sample 301 may be in a cylindrical configuration. Rock sample 301 is well-defined, having both a sample length 6000 and a sample diameter 6500. Further, in one or more embodiments, the rock sample may be a cutting rock sample. Cutting rock samples, better known in the industry as simply "cuttings", are fragments of a formation that are the resultant of drilling operation, such as by drilling by a drill bit, acting against the subsurface.

As also shown in FIG. 3, one or more scanning axis may be envisioned in relation to the configuration of the rock sample, which may be useful in detecting properties of the rock sample. For example, a first axis 7000 may be an imaginary line that is in alignment with the sample length 6000, that is, running parallel with in this case with the height dimension of the cylindrical configuration of the rock sample 301. Similarly, a second axis 7500 may be an imaginary line that is in alignment with the sample diameter 6500, that is, running parallel with the width dimension of the cylindrical configuration of the rock sample. In one or more embodiments, where two or more axis are utilized, two or more axes may be aligned perpendicular with one another, such as in the case of rock sample 301 of FIG. 3, where first axis 7000 is perpendicular with second axis 7500.

Figure 4:
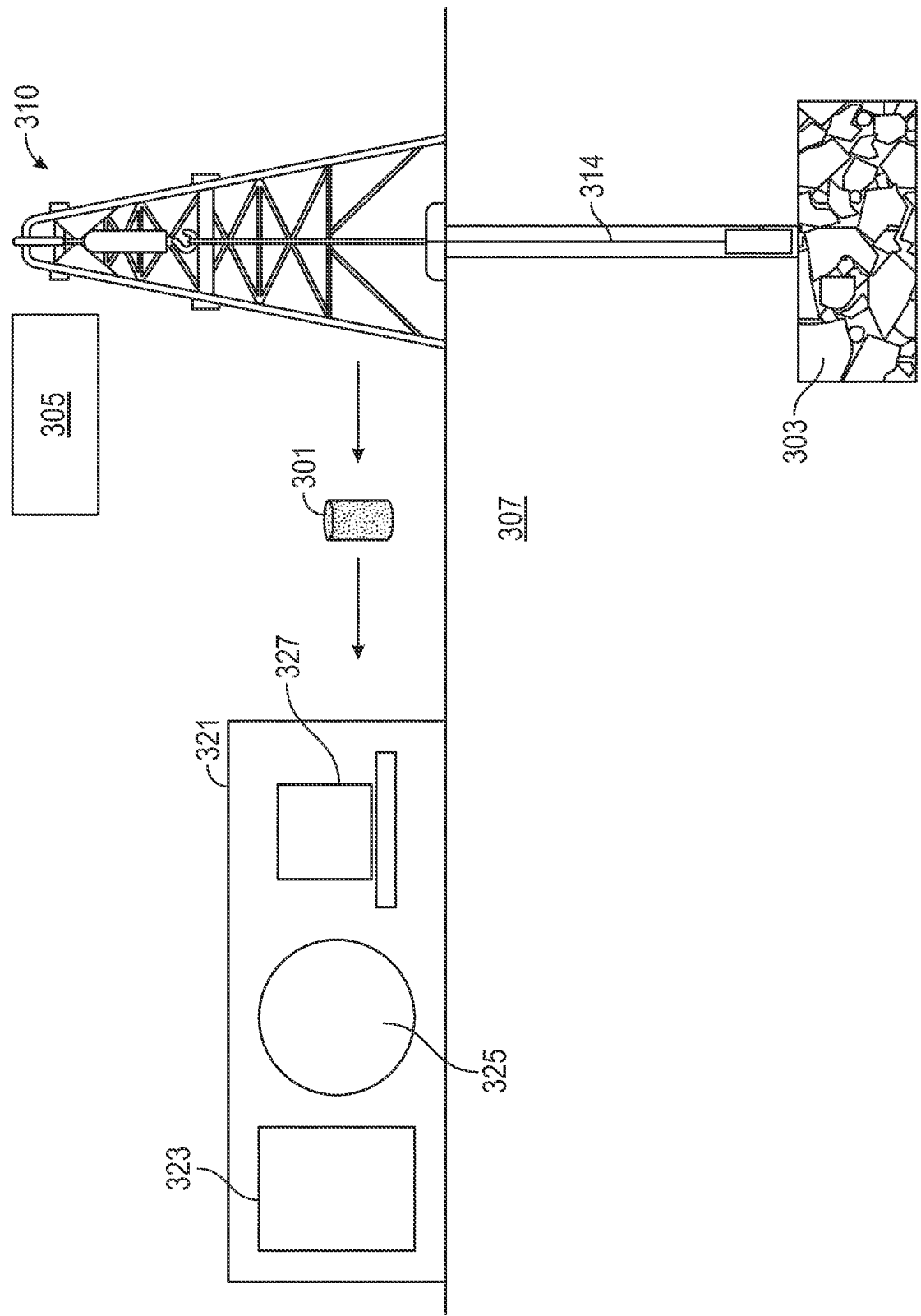
FIG. 4 illustrate a drilling site and an NMR facility according to one or more embodiments.

FIG. 4 depicts an example of a drilling site 310 and an NMR facility 321. In some instances, providing a rock sample may include obtaining it from a formation. First a rock sample 301 may be obtained from a subsurface 307. Interest may exist in determining the permeability of a particular formation 303, such as a reservoir. The formation 303 may have complex and heterogenous porosity as are found in certain carbonate formations; therefore, analysis may need to be performed at the surface 305. A rock sample may be removed from the formation 303 during a drilling operation, transported though a wellbore 314 and collected at the surface 305. Once the rock sample is collected at the surface 305, the rock sample 301 may be relocated to an NMR facility 321.

In one or more embodiments, the rock sample may be washed and cleaned to remove impurities, such as mud and oil. In one or more embodiments, a solvent may be used to remove the impurities contained on the surface and in the pores of the rock sample. In one or more embodiments, a device, such as a centrifuge, may also be used to remove the impurities as well as the solvent. Impurities and solvents are removed because they may interfere with detecting NMR spectral data. Those skilled in the art will appreciate that various additional techniques that may be used to wash and clean the rock sample.

In one or more embodiments, an additional processing step may include modifying the shape and size of the rock sample. The resultant size and shape of the modified rock sample may depend on downstream apparatus limitations, such as the centrifuges and NMR equipment at an NMR facility, such as shown in FIG. 4.

As provided in the FIG. 2 workflow 200, after the rock sample 301 has been provided and, if necessary, cleaned, the rock sample is saturated in a water solution 103. In one or more embodiments, brine may be used to saturate the rock sample instead of water. In one or more embodiments, the sample is placed in a water filled container and saturated under vacuum. To verify that a rock sample is fully saturated, the rock sample may be weighed multiple times until no change in the weight of the rock sample occurs. Even though water saturation is described in the workflow 200, a person having skill in the art will appreciate that the rock sample 301 may be saturated with other fluids if permeability data of other fluids is desired instead of water.

At an NMR facility 321 of FIG. 4, several properties of the rock sample may be analyzed. The NMR facility 321 may be equipped with various tools and apparatus allowing additional processing and data collection and analysis of the rock sample 301, including those apparatus required to carry out the steps described in the workflow 200. Some of the apparatus housed in the NMR facility may include centrifuges 325 used to desaturate the rock samples, NMR equipment 323 used to obtain NMR data, and processors 327 to analyze the results. Those having skill in the art would appreciate that additional tools, apparatus, equipment, and chemical solutions may be required to complete the steps in workflow 200.

As provided in the FIG. 2 workflow 200, after saturating the rock sample with water, spatial NMR spectroscopy of the rock sample is performed 105. The primary functioning parts of an NMR system may include a magnet, gradient coils, RF (radio frequency) equipment, and computer processors. The magnet is used to create an external magnetic field that penetrates throughout the rock sample. The RF equipment may be used to transmit the RF pulse that induces the atoms to emit a signal, receive the emitted signal and amplify it so it can be manipulated by the computer processors.

In the NMR technique, a rock sample may be positioned in a magnetic field. In the presence of a magnetic field, $B_0$, the magnetic nuclear spins of protons (hydrogens) align in the direction of the magnetic field. The applied magnetic field may be uniform or there may be a magnetic field gradient along a certain direction. The alignment of the magnetic nuclear spins may be perturbed by a weak oscillating magnetic field pulse. The weak oscillating magnetic field pulse that may be a radio-frequency pulse. The RF pulse, $B_1$, induces movement in the transverse (x-y) plane. After the RF pulse, the magnetic nuclear spins of the protons realign in the direction of the magnetic field, $B_0$, and the movement induced by the RF pulse in the transverse plane diminishes. Measurements may be made of the decaying signals of the nuclear spin of protons at various times in response to the magnetic field. The signal decaying time of the protons to completely dephase in the transverse plane may be referred to as the $T_2$ transverse relaxation time, and the amplitude of the signals may be detected. The amplitudes of the signal decaying time are used by the computer processors to generate an image.

Typically, the area to be imaged is scanned by a sequence of measurement cycles where the gradient varies according to the particular position measurement method being used. The resulting set of received NMR signals is digitized and processed to reconstruct the image using one of many well-known reconstruction techniques known to those having skill in the art. The measurements of amplitude versus time and the derived image may be used to determine the $T_2$ spatial distribution of the rock sample. The $T_2$ spatial distributions obtained from the NMR technique may be used to accurately predict various properties of the rock sample, including the porosity, pore-size, pore-fluid properties, and permeability of the rock sample and the corresponding geological formation.

In one or more embodiments, the method used to measure spatially-resolved $T_2$ ($T_2$ mapping) is Spin Echo Single Point Imaging (SE-SPI). Many conventional methods used for $T_2$ mapping may be problematic either due to local gradient distortions or short $T_2$. In SE-SPI, spatial encoding precedes $T_2$ relaxation. The magnetization is phase encoded during the first pulse interval and then readout through multiple refocusing. To preserve the introduced phase shift upon refocusing, an XY-16 phase cycle is applied and a hard (full-excitation) 90-degree pulse is used.

Each of FIGS. 5A-D illustrate a general step in method 200; however, a person having skill in the art will appreciate that certain steps may be modified or rearranged.

Figure 5A:
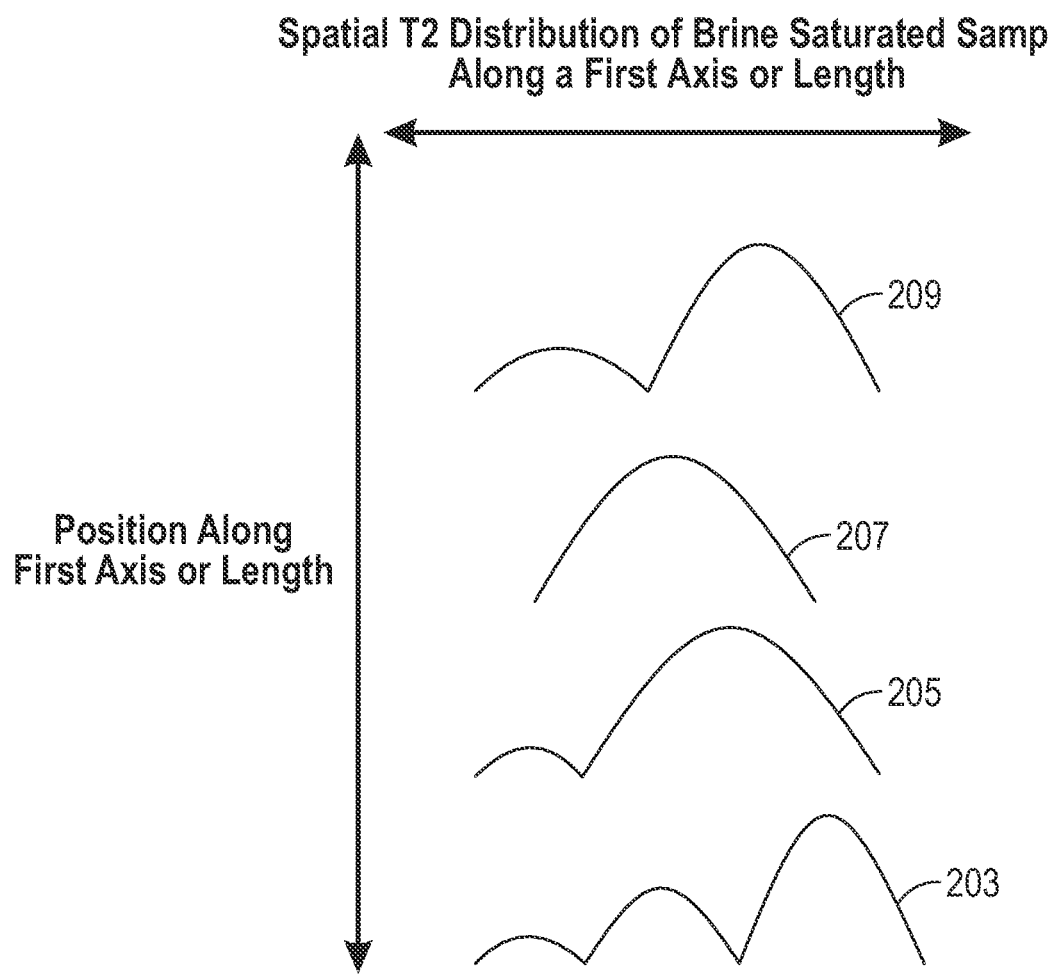
FIG. 5A illustrates a general step of the workflow according to one or more embodiments.

FIG. 5A illustrates a general step of the workflow. FIG. 5A is a diagram of detected NMR measurements of the $T_2$ NMR distributions of a saturated rock sample that are spatially arranged according to their sequential position along a first core sample axis, such as received as the result of performing step 105 of method 200. The $T_2$ NMR distribution of a saturated rock sample may be obtained by acquiring $T_2$ NMR scan measurements along a first core sample axis of the rock sample in a desired orientation. In FIG. 5A, four $T_2$ NMR distribution measurements are detected along a first core sample axis of a rock sample. The four $T_2$ NMR distribution measurements are represented as four $T_2$ NMR distribution curves 203, 205, 207, and 209, respectively, and are sequentially arranged based on their positions along a first core sample axis of a rock sample. A particular $T_2$ NMR distribution may be similar or different from other detected $T_2$ NMR distributions from a rock sample. Also, the detected $T_2$ NMR distribution curves may have different shapes and may have one or more peaks. For example, the detected $T_2$ NMR distribution curve 207 only has one peak whereas the detected $T_2$ NMR distribution curve 209 has two identifiable peaks. This may indicate that a first position along a first core sample axis for the rock sample, as shown by the detected $T_2$ NMR distribution curve 207, has a different porosity and pore structure with respect to a second position along a first core sample axis for the rock sample, as shown by the detected $T_2$ NMR distribution curve 209. The detected data from multiple $T_2$ NMR distribution curves may be utilized to determine the heterogeneity, complexity, porosity, and the pore structure along a first core sample axis of the rock sample.

The NMR technique allows $T_2$ NMR distributions to be detected for any desired orientation—it is not required to detect the $T_2$ NMR distributions along a normal plane to an axis as provided in the workflow. Therefore, the permeability profile may be obtained along any positional direction of a rock sample, such as by using acute or obtuse angles relative to the axis from which the scans are being performed.

In one or more embodiments, the measurements generated by the NMR technique may be logged by NMR logging systems and apparatus. Logged NMR measurements may be illustrated as a $T_2$ signal amplitude versus time to determine a $T_2$ spatial distribution as a function of their $T_2$ times (forthcoming). In one or more embodiments, identified pore systems through this process may be saved and used later for subsequent NMR logging of the same or different formations having the same rock type.

As provided in workflow 200 as shown in FIG. 2, the water is removed from the rock sample 301 by desaturation 107. In one or more embodiments, a technique used is to desaturate the rock sample 301 is to spin the rock sample 301 in a centrifuge unit 325. This causes a certain amount of fluid to drain from the rock sample 301 due to centrifugal forces. Generally, spinning the rock sample 301 in one direction produces a saturation distribution along the core of the rock sample 301. To achieve uniform saturation distribution. The rock sample 301 may be spun in the centrifuge unit 325 at low speeds. In one or more embodiments, the rock sample 301 is spun for a second time in the opposite direction in the centrifugal unit 325. The second spin may be performed at the same speed that was utilized the first time. Spinning the rock sample in the opposite direction the second time ensures that a uniform saturation distribution is obtained.

In one or more embodiments, the porous plate technique may be used to desaturate the rock sample. In such embodiments, a water wet porous plate is placed between the rock sample 301 and the downstream end of a rock sample holder. A desaturation pressure may be applied. Also, to ensure capillary continuity, water-saturated filter paper may be placed between the porous-plate and the rock sample 301. Subsequently, a pressurized gas may be applied to the rock sample until no more water production is measured in a fluid receiver placed downstream. In this technique, only water is produced at the downstream end due to water-wet nature of the porous-plate.

As provided in the FIG. 2 workflow 200, after water is removed from the rock sample 301 by desaturation 107 NMR spectroscopy of the rock sample is performed 109 for a second time. The spatial $T_2$ NMR distribution of the desaturated rock sample 301 is detected by $T_2$ mapping NMR pulse sequence. The spatial $T_2$ measurements of the desaturated rock sample may be performed with the same or substantially the same vertical resolution that was used the first time to obtain spatial $T_2$ measurements for the saturated rock sample 301.

Figure 5B:
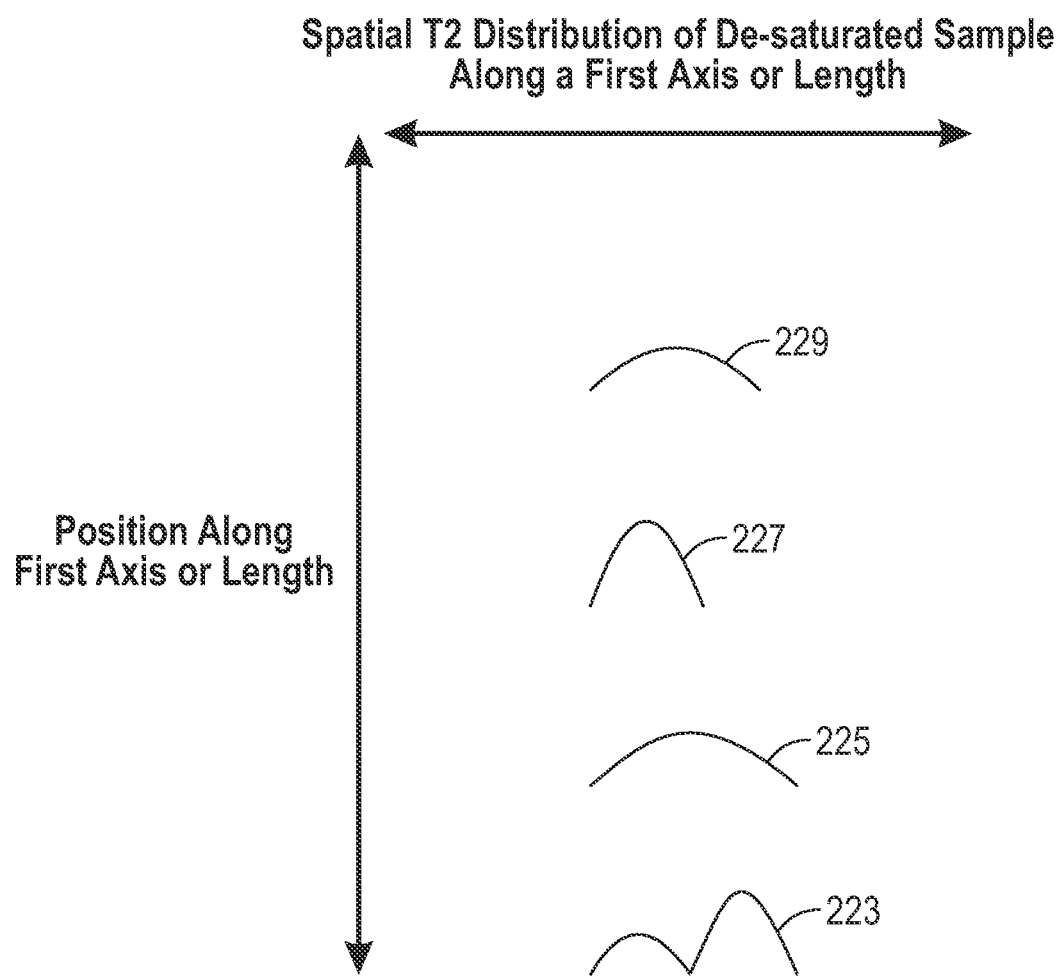
FIG. 5B illustrates a general step of the workflow according to one or more embodiments.

FIG. 5B illustrates a general step of the workflow. FIG. 5B is a diagram of detected NMR measurements of $T_2$ NMR distributions of a desaturated rock sample that are spatially arranged according to their sequential position along a first core sample axis, such as in step 109 of method 200. The $T_2$ NMR distribution of the desaturated rock sample may be obtained by acquiring $T_2$ NMR measurements along the first core sample axis of the rock sample. In one or more embodiments, the same orientation and positions that were used for the saturated rock sample are used for the desaturated rock sample when making $T_2$ measurements along the first core sample axis. In FIG. 5B, four $T_2$ NMR distribution measurements are detected along the first core sample axis of the rock sample in the same first core sample axis positions that were scanned in step 105. The four $T_2$ NMR distribution measurement positions are represented as four detected $T_2$ NMR distribution curves 223, 225, 227, and 229, respectively, and are sequentially arranged based on their positions along the first core sample axis of a rock sample. The detected four $T_2$ NMR distribution curves 223, 225, 227, 229 for the desaturated rock sample may be analyzed with the four corresponding detected $T_2$ NMR distribution curves 203, 205, 207, 209 from FIG. 5A (step 105) for the saturated rock sample. The detected $T_2$ NMR distribution curves may have different shapes and may have one or more peaks or may have different detected curves in the saturated versus the desaturated state. For example, the $T_2$ NMR distribution curve 203 at a particular position has three peaks when the rock sample is saturated but only two peaks for the $T_2$ NMR distribution curve 223 of the desaturated sample at the same position along the first core sample axis. Also, the $T_2$ NMR distribution curves for the saturated and the corresponding desaturated rock sample positions may vary by sizes. For example, the $T_2$ NMR distribution curve 203 for a saturated rock sample is larger than the corresponding $T_2$ NMR distribution curve 223 for the desaturated sample at the same position along the first core sample axis.

Figure 6:
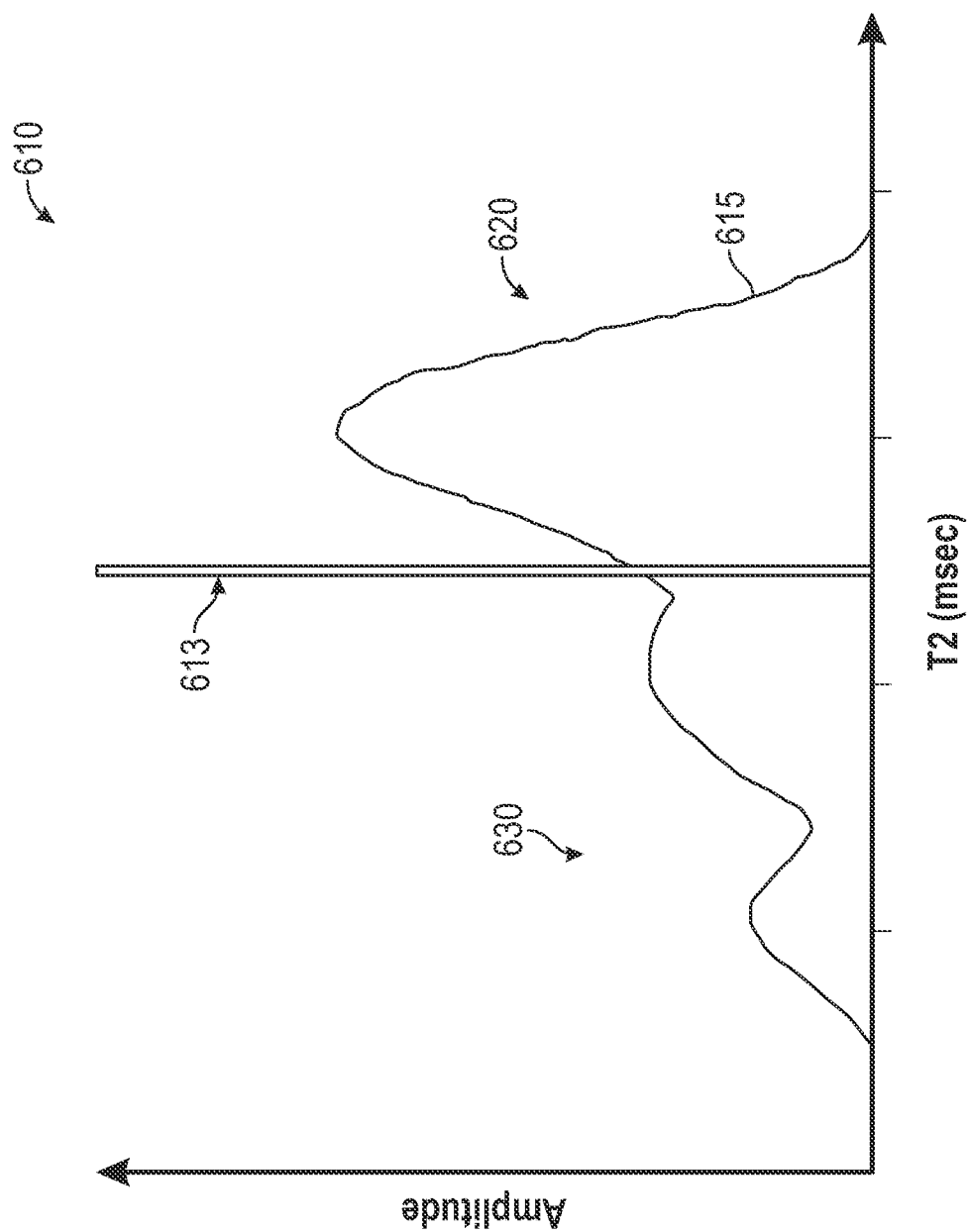
FIG. 6 illustrates a graph of $T_2$ NMR distribution that may be used to calculate $T_2$ cutoff values according to one or more embodiments.

Once $T_2$ NMR distributions have been detected by NMR spectroscopy of the saturated and desaturated rock sample 105, 109 the generated data may be analyzed. An analysis preformed for pore structure evaluation may be used to derive NMR $T_2$ cutoff values for the $T_2$ NMR distributions. FIG. 6 shows a simple graph of a $T_2$ NMR distribution that plots amplitude over time 610. The amplitude distribution may have one or more higher peaks and one or more lower peaks. The higher amplitude peaks correspond to larger pores and the lower amplitude peaks correspond to smaller pores. The smaller pores are less likely to contain free fluid and therefore less likely to produce oil and gas. The larger pores are more likely to contain free fluid (mobile fluid) and therefore more likely to produce oil and gas. Referring to FIG. 6, the $T_2$ cutoff 613 in a $T_2$ NMR distribution 615 is the $T_2$ value that divides the smaller pores from the larger pores. Thus, the $T_2$ NMR distribution of the curve above the $T_2$ cutoff is a measure of the free fluid in the rock 620. The $T_2$ NMR distribution of the curve below the $T_2$ cutoff is a measure of the bound fluid 630. Bound fluid may be made up of clay bound fluid and the capillary bound fluid. In one or more embodiments, reference $T_2$ cutoff values may be used along with the detected core data to derive $T_2$ cutoff values. For example, reference value for sandstones is approximately 33 ms (milliseconds) and approximately 90 ms to 100 ms for carbonates.

Figure 5C:
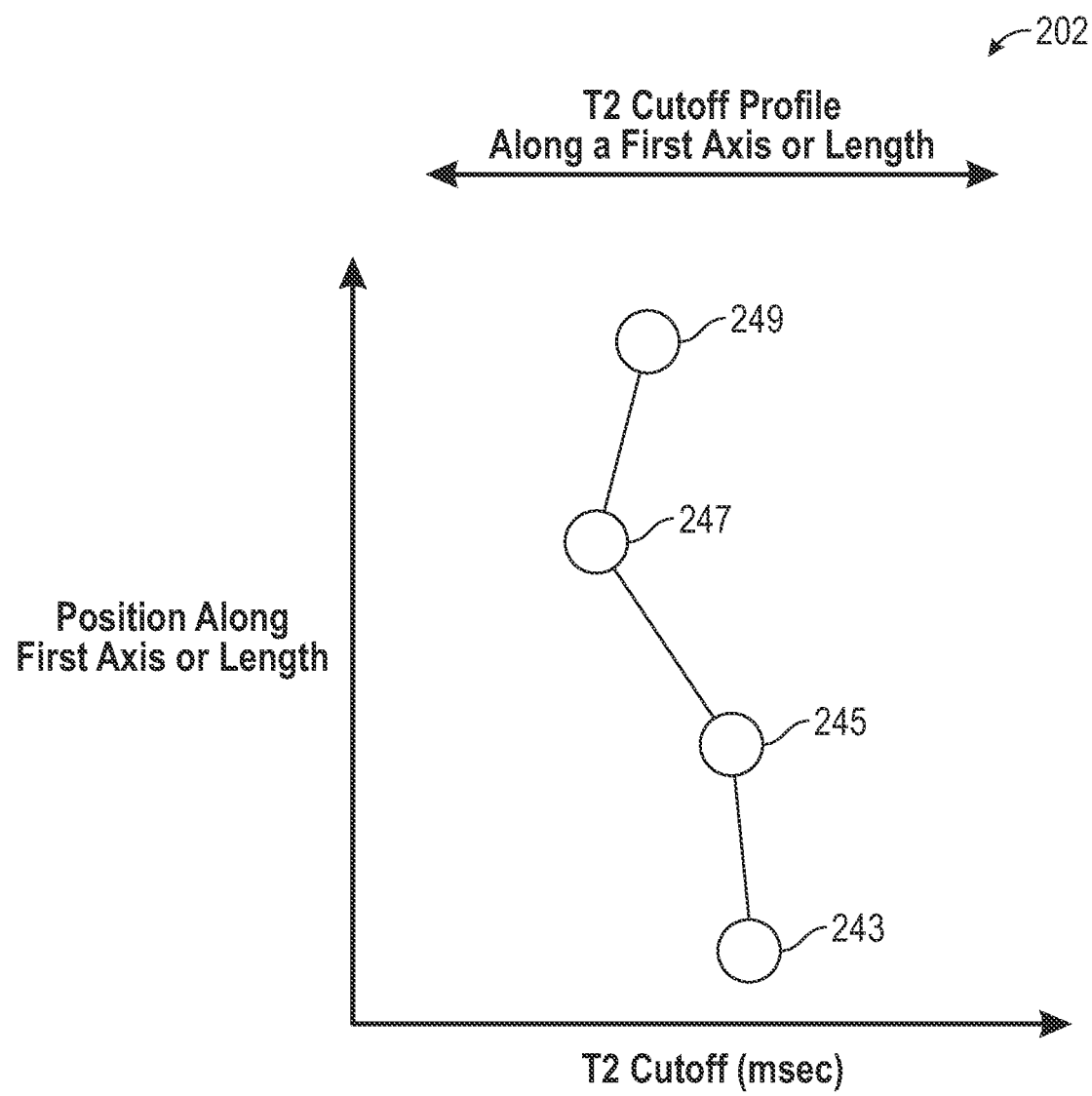
FIG. 5C illustrates a general step of the workflow according to one or more embodiments.

FIG. 5C illustrates a general step of the workflow. FIG. 5C shows a series of analyses to determine spatial $T_2$ NMR permeability. This image is in respect to step 110 of method 200. The determined $T_2$ cutoff values for each position along the core sample axis of the rock sample may be plotted in relative position to give spatial information about the porosity and pore structure along the core sample axis of the rock sample. In FIG. 5C, four determined $T_2$ cutoff values 243, 245, 247, and 249, respectfully, are plotted in a graph displaying positional $T_2$ cutoff values 202 along the first core sample axis. Each $T_2$ cutoff value is determined from data obtained from the detected saturated and desaturated $T_2$ NMR distribution curves at the same position along the core sample axis of the rock sample. For example, $T_2$ cutoff value 249 is determined from the corresponding detected saturated rock sample $T_2$ NMR distribution curve 209 from FIG. 5A and detected desaturated rock sample $T_2$ NMR distribution curve 229 from FIG. 5B at the same position along the core sample axis. The $T_2$ cutoff values in the rock samples along the core sample axis may differ significantly. For example, the $T_2$ cutoff values for position 245 and 247 along the core sample axis vary significantly, showing possible variations in porosity and pore structure in the rock sample. Rock samples from heterogenous formations may have varying $T_2$ values, which may possibly indicate complex pore structures and heterogeneity along the core sample axis of the rock sample and the formation from which the rock was obtained.

Spatial permeability of $T_2$ NMR distributions is calculated by NMR permeability models to produce permeability profile along the rock sample. The permeability of the rock sample 301 cannot be measured directly but can be derived by NMR data. In one or more embodiments, spatial permeability may be derived from permeability models that may utilize the porosity data obtained from NMR $T_2$ relaxation times to predict permeability.

In one or more embodiments, the permeability estimation model used to derive spatial permeability for NMT $T_2$ NMR distribution is the Timur-Coates model.

In one or more embodiments, the permeability estimation model used to derive spatial permeability is the geometric mean of relaxation time model (T2 gm).

Figure 5D:
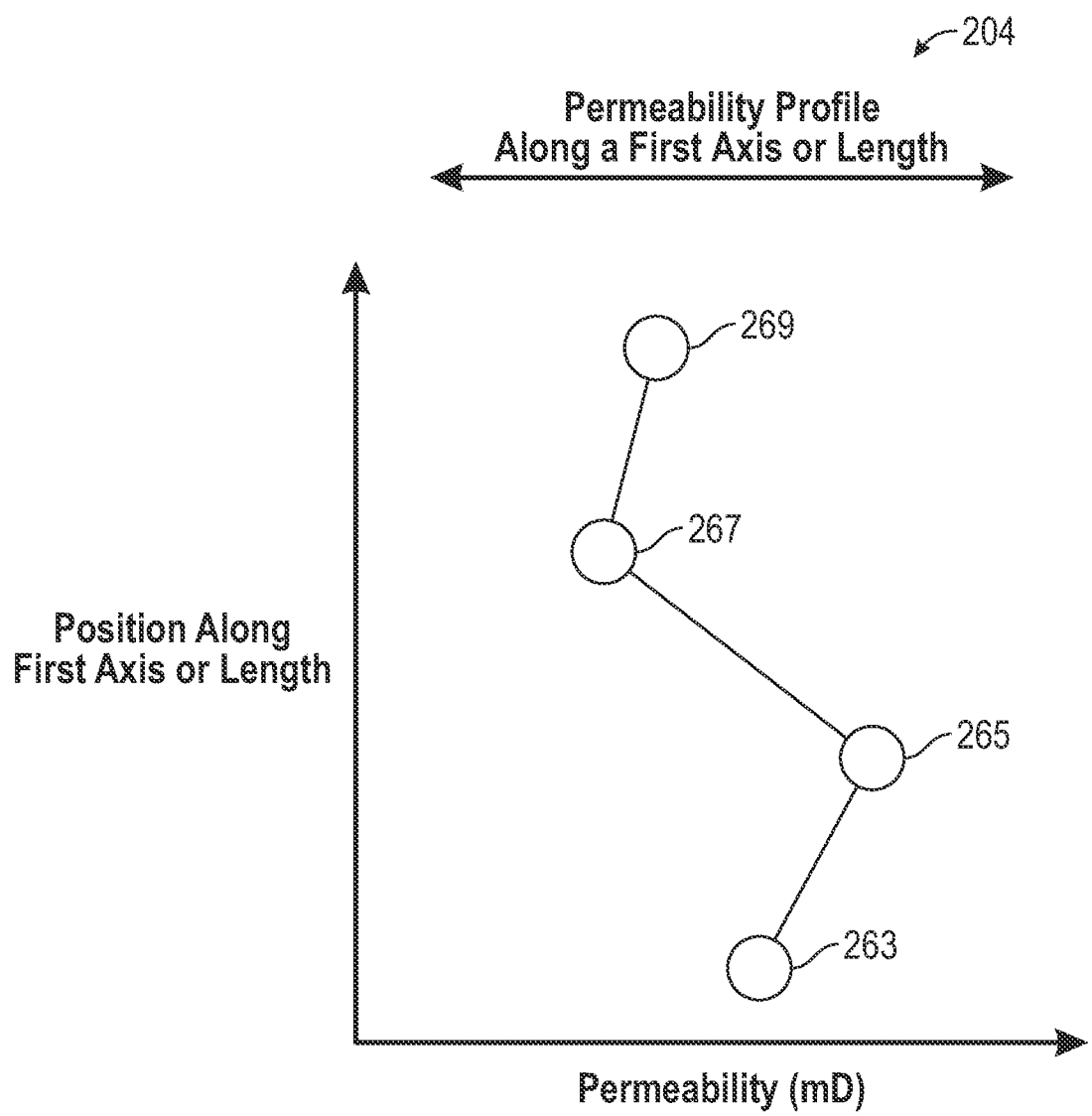
FIG. 5D illustrates a general step of the workflow to one or more embodiments.

FIG. 5D illustrates a general step of the workflow. FIG. 5D shows a series of analyses to determine spatial $T_2$ NMR permeability. This image is in respect to step 111 of method 200. The data collected from $T_2$ NMR may be used to predict the permeability of a rock sample. For example, the relaxation times, $T_2$ NMR distributions, $T_2$ cutoff values, and other NMR data previously determined may be used to determine permeability by using permeability models along the core sample axis for the rock sample. In FIG. 5D, four permeability prediction values 263, 265, 267, and 269, respectively, are plotted in a graph displaying positional permeabilities 204 to give a permeability profile along the core sample axis for the rock sample. Each particular permeability point is determined from data obtained from the $T_2$ cutoff, the saturated $T_2$ NMR distribution curve, and the desaturated $T_2$ NMR distribution curve at the same position along the core sample axis of the rock sample. For example, a permeability point 269 is determined from a corresponding $T_2$ cutoff value 249 from FIG. 5C, the corresponding saturated $T_2$ NMR distribution curve 209 From FIG. 5A, and the desaturated rock sample 229 from FIG. 5B at the same position along the core sample axis of the rock sample. The permeability estimates along the length of a rock sample may vary significantly. For example, the sequential permeability predictions for position 265 and 267 along the core sample axis of the rock sample vary significantly, showing possible variations in the permeability across the rock sample along the core sample axis. Multiple permeability points may be mapped according to their positions to give the spatial permeability of the rock sample and the corresponding formation. As an example, in carbonate formations, the heterogeneity and complexity of pore systems may cause large variations in permeability of the rock, making accurate and detailed spatial predictions and modeling more important.

Figure 7:
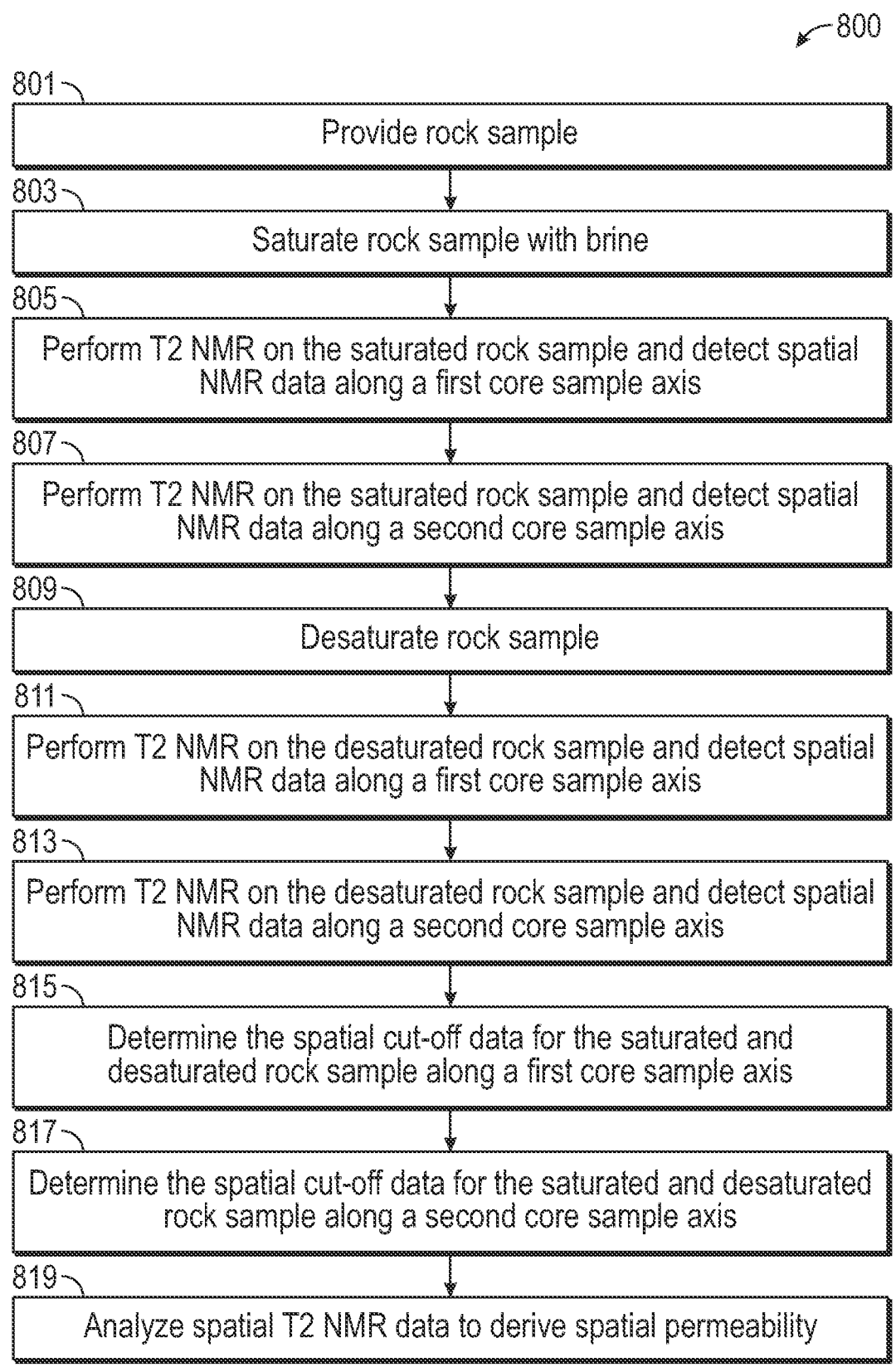
FIG. 7 illustrates a workflow according to one or more embodiments.

FIG. 7 illustrates a second workflow. The steps may include: Providing a rock sample 801; saturating the rock sample with water 803; detecting spatial NMR data from the saturated rock sample by performing $T_2$ NMR measurements along a first core sample axis 805; detecting spatial NMR data from the saturated rock sample by performing $T_2$ NMR measurements along a second core sample axis 807; desaturating the rock sample 809; detecting spatial NMR data from the desaturated rock sample by performing $T_2$ NMR measurements along a first core sample axis 811; detecting spatial NMR data from the desaturated rock sample by performing $T_2$ NMR measurements along a second core sample axis 813; determining the spatial cut-off data both the saturated and desaturated samples along a first core sample axis 815; determining the spatial cut-off data both the saturated and desaturated samples along a second core sample axis 817; and analyzing the spatial NMR cut-off data to determine spatial permeability of the rock sample 819.

Each of FIGS. 8A-D illustrate a general step in method 800; however, a person having skill in the art will appreciate that certain steps may be modified or rearranged. Method 800 utilizes multiple directional NMR scans to obtain NMR data in different positional directions along a plurality of axis of the rock sample to ultimately derive multiple different permeability profiles of a single sample according to one or more embodiments.

Figure 8B:
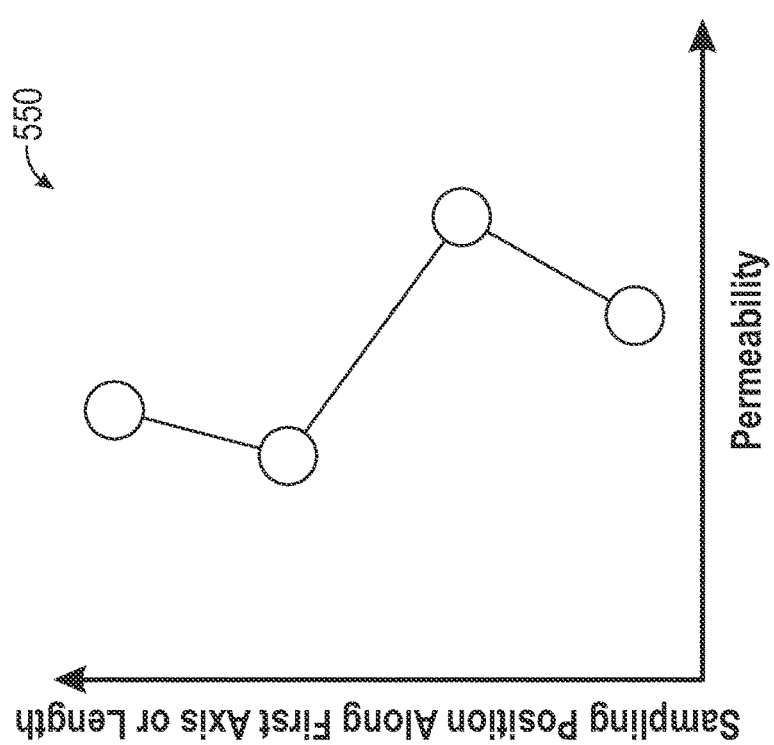
FIG. 8B illustrates determining spatial permeability profiles along a first sample axis according to one or more embodiments.
Figure 8A:
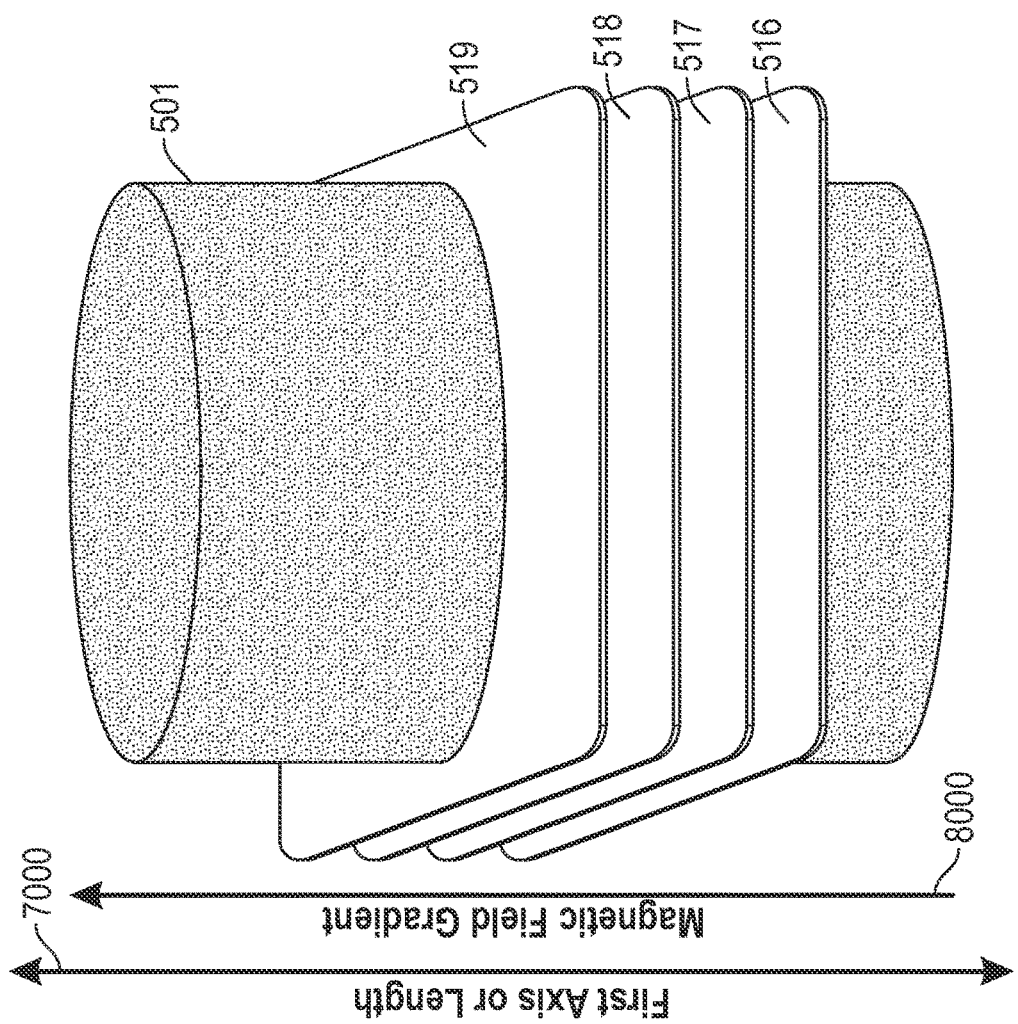
FIG. 8A illustrates detecting spatial permeability profiles along a first sample axis according to one or more embodiments.

FIG. 8A illustrates a general step of the workflow. FIG. 8A illustrates a series of $T_2$ NMR spatial distribution scans being conducted on a rock sample along a first core sample axis, in this case a length of the cylindrical rock sample 501. A vertical magnetic field gradient (arrow) is applied to a rock sample 501. The planes 516, 517, 518, and 519, respectively, depicted passing through the rock sample 501 show the positions where $T_2$ NMR spatial distribution scans are performed, and data is detected. In FIG. 8A, the $T_2$ NMR scans are performed sequentially along the first core sample axis of the rock sample. For example, plane 516 and plane 517 have a differential in distance along the first core sample axis vertically.

The demonstrated actions of FIG. 8A are repeated twice. First, it is done for detecting spatial NMR data from the saturated rock sample by performing $T_2$ NMR measurements along a first core sample axis 805. It is also done for detecting spatial NMR data from the desaturated rock sample by performing $T_2$ NMR measurements along a first core sample axis 811. In between these two scans, the desaturating the rock sample 809.

FIG. 8B illustrates a general step of the workflow. FIG. 8B illustrates a permeability profile derived along the first core sample axis of rock sample 501. After following the workflow for method 800, the positional permeabilities are graphed 550 in a similar manner as provided for in FIG. 5D with graph 204.

FIG. 8C illustrates a general step of the workflow. FIG. 8C illustrates a series of $T_2$ NMR spatial distribution scans being conducted on a rock sample along a second core sample axis, in this case a diameter of the cylindrical rock sample 501. A horizontal magnetic field gradient (arrow) is applied to a rock sample 501. The planes 536, 537, 538, and 539, respectively, depicted passing through the rock sample 501 show the positions where $T_2$ NMR spatial distribution scans are performed, and data is detected. In FIG. 8C, the $T_2$ NMR scans are performed sequentially along the second core sample axis of the rock sample. For example, square plane 536 and square plane 537 have a differential in distance along the second core sample axis vertically.

The demonstrated actions of FIG. 8C are repeated twice. First, it is done for detecting spatial NMR data from the saturated rock sample by performing $T_2$ NMR measurements along a second core sample axis 807. It is also done for detecting spatial NMR data from the desaturated rock sample by performing $T_2$ NMR measurements along a second core sample axis 813. In between these two scans, the desaturating the rock sample 809.

FIG. 8D illustrates a general step of the workflow. FIG. 8D illustrates a permeability profile derived along the second core sample axis of rock sample 501. After following the workflow for method 800, the positional permeabilities are graphed 560 in a similar manner as provided for in FIG. 5D with graph 204, except in this case the positional permeabilities are graphed with respect to the second core sample axis, in this case horizontally.

Unless defined otherwise, all technical and scientific terms used have the same meaning as commonly understood by one of ordinary skill in the art to which these systems, apparatuses, methods, processes, and compositions belong.

The singular forms "a," "an," and "the" include plural referents, unless the context clearly dictates otherwise.

As used here and in the appended claims, the words "comprise," "has," and "include" and all grammatical variations thereof are each intended to have an open, non-limiting meaning that does not exclude additional elements or steps.

When the word "approximately" or "about" are used, this term may mean that there can be a variance in value of up to ±10%, of up to 5%, of up to 2%, of up to 1%, of up to 0.5%, of up to 0.1%, or up to 0.01%.

Ranges may be expressed as from about one particular value to about another particular value, inclusive. When such a range is expressed, it is to be understood that another embodiment is from the one particular value to the other particular value, along with all particular values and combinations thereof within the range.

While the disclosure includes a limited number of embodiments, those skilled in the art, having benefit of this disclosure, will appreciate that other embodiments may be devised which do not depart from the scope of the present disclosure. Accordingly, the scope should be limited only by the attached claims.

What is claimed as new and desired to be protected by Letters Patent of the United States is:

1. A method for predicting spatial permeability of a rock sample, comprising the steps of:
    providing a rock sample having a first core sample axis and a second core sample axis wherein the first core sample axis and second core sample axis are in different directions;
    saturating the rock sample with an aqueous solution;
    detecting spatial NMR data along the first core sample axis by performing $T_2$ NMR on the saturated rock sample;
    desaturating the rock sample;
    detecting spatial NMR data along the first core sample axis by performing $T_2$ NMR on the desaturated rock sample;
    determining the spatial cutoff data for the saturated and desaturated rock sample along the first core sample axis;
    detecting spatial NMR data along the second core sample axis by performing $T_2$ NMR on the saturated rock sample;
    detecting spatial NMR data along the second core sample axis by performing $T_2$ NMR on the desaturated rock sample; and
    determining the spatial cutoff data for the saturated and desaturated rock sample along the second core sample axis; and
    deriving spatial permeability by analyzing the spatial NMR data.

2. The method of claim 1, wherein the rock sample is provided from a subsurface formation.

3. The method of claim 1, wherein the rock sample is carbonate rock.

4. The method of claim 1, wherein the rock sample is sandstone rock.

5. The method of claim 1, further comprising modifying the rock sample into a geometric shape.

6. The method of claim 5 where the geometric shape is a cylinder having a diameter and a length.

7. The method of claim 6 where the core sample axis is the length of the cylinder.

8. The method of claim 1, further comprising cleaning the rock sample before saturating.

9. The method of claim 8, wherein a solvent is used to clean the rock sample.

10. The method of claim 1, wherein the aqueous solution is a brine.

11. The method of claim 1, wherein Spin Echo Single Point Imaging (SE-SPI) is used for T2 mapping.

12. The method of claim 1, wherein the rock sample is desaturated by the centrifuge method.

13. The method of claim 1, wherein the rock sample is desaturated by the porous plate method.

14. The method of claim 1, wherein permeability is derived from the Timur-Coates permeability model.

15. The method of claim 1, wherein permeability is derived from the geometric mean of relaxation time (T2GM) model.

16. The method of claim 1 where the rock sample is in the form of a cylinder, the first core sample axis is a length of the cylinder, and the second core sample axis is the diameter of the cylinder.

* * * * *